United States Patent
Kosonocky

(10) Patent No.: US 8,561,004 B2
(45) Date of Patent: Oct. 15, 2013

(54) RING POWER GATING WITH DISTRIBUTED CURRENTS USING NON-LINEAR CONTACT PLACEMENTS

(75) Inventor: Stephen V. Kosonocky, Fort Collins, CO (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 133 days.

(21) Appl. No.: 12/758,525

(22) Filed: Apr. 12, 2010

(65) Prior Publication Data

US 2011/0186930 A1 Aug. 4, 2011

Related U.S. Application Data

(60) Provisional application No. 61/301,431, filed on Feb. 4, 2010.

(51) Int. Cl.
*G06F 17/50* (2006.01)
*G06F 9/455* (2006.01)

(52) U.S. Cl.
USPC ........... 716/133; 716/100; 716/101; 716/110; 716/120; 716/132; 716/134; 716/135; 438/129

(58) Field of Classification Search
USPC ......... 716/100–101, 110, 120, 127, 132–135; 438/129
See application file for complete search history.

(56) References Cited

U.S. PATENT DOCUMENTS

| | | | |
|---|---|---|---|
| 5,977,587 A | 11/1999 | Kito | |
| 6,097,621 A * | 8/2000 | Mori | 365/63 |
| 6,768,206 B2 * | 7/2004 | Hosomi | 257/774 |
| 7,249,336 B2 * | 7/2007 | Nagata et al. | 716/120 |
| 7,509,613 B2 * | 3/2009 | Frenkil | 716/120 |
| 7,882,482 B2 * | 2/2011 | Ueunten | 716/100 |
| 7,908,499 B2 * | 3/2011 | Ito | 713/320 |
| 7,956,384 B2 * | 6/2011 | Mallikararjunaswamy | 257/203 |
| 2008/0290419 A1 | 11/2008 | Leibiger | |

FOREIGN PATENT DOCUMENTS

DE 103 22 594 A1 12/2003

OTHER PUBLICATIONS

International Search Report and Written Opinion for Application No. PCT/US2011/023551, mailed Apr. 7, 2011, (10 pages).
Shin'ichiro Mutoh. "1-V Power Supply High-Speed Digital Circuit Technology with Multithreshold-Voltage CMOS." IEEE Journal of Solid-State Circuits, vol. 30, No. 8. Aug. 1995. pp. 847-854.

* cited by examiner

*Primary Examiner* — Nghia Doan
(74) *Attorney, Agent, or Firm* — Abel Law Group, LLP

(57) ABSTRACT

A power gate includes a series of electrical contacts along at least a portion of an integrated circuit and a series of power gate transistors electrically coupled to the electrical contacts on the integrated circuit to form a power gate boundary, e.g., at the integrated circuit periphery. The electrical contacts along at least a portion of a running length of the power gate boundary define a substantially non-linear profile. The non-linear profile provides increased contact density which improves current balancing across the electrical contacts and current throughput through the power gate. The non-linear profile is a sinusoidal or zigzag pattern with intermediate offset bump contacts. The contact profiles along the power gate boundary can include both linear and non-linear profiles.

18 Claims, 5 Drawing Sheets

RING POWER GATING WITH DISTRIBUTED CURRENTS USING NON-LINEAR CONTACT PLACEMENTS

CROSS-REFERENCE TO RELATED APPLICATION(S)

This application claims the benefit of U.S. provisional application No. 61/301,431, filed Feb. 4, 2010, entitled "Ring Power Gating with Distributed Currents Using Non-Linear C4 Contact Placements," naming inventor Stephen V. Kosonocky, which application is hereby incorporated by reference.

FIELD OF THE INVENTION

This invention relates to power gating, and in particular to placement of ring power gating contacts.

BACKGROUND

Ring style power gating involves placing a ring of power gate transistors typically around the periphery of an integrated circuit block, e.g., a microprocessor core, and directing or funneling the VSS or VDD current through the ring of transistors, from a power supply. See S. Mutoh, T. Douseki, Y. Matsuya, T. Aoki, S. Shigematsu, and J. Yamada, "1-V Power Supply High-Speed Digital Circuit Technology with Multi-threshold-Voltage CMOS," IEEE J. Solid-State Circuits 30, No. 8, pp. 847-854, August 1995, which is incorporated herein in its entirety by reference.

In some applications, a maximum current throughput is a limiting design or performance parameter. In particular, a problem exists in high frequency processors where current crowds at the power gate ring border and exceeds the current limits of the C4 electrical contact bumps connected to one or both sides of the power gate ring.

One proposed solution to this problem is to limit the maximum current of the circuit block that is power gated. However, this will limit the performance of the circuit block and will limit the regions where ring style power gating can be used.

Alternatively, integrated power gating can be used to distribute the power gates throughout the integrated circuit block being gated. Such distributed power gating, however, adds design complexity, which can require significant additional design time for a CPU core.

Accordingly, improvements are sought in ring power gating.

SUMMARY OF EMBODIMENTS OF THE INVENTION

One aspect of the invention features a power gate including a series of electrical contacts on a portion of an integrated circuit block, e.g., along a periphery of a microprocessor, graphics processor, or other IC, a series of power gate transistors electrically coupled to the electrical contacts on the block to form a power gate boundary. The electrical contacts along at least a portion of a running boundary length define a substantially non-linear profile.

The substantially non-linear profile is configured and arranged to provide an increased contact density relative to a substantially linear profile for a fixed contact spacing over the running boundary length.

In some implementations, the power gate is a ring power gate.

Another aspect of the invention features a power gate ring including a series of electrical contacts on a portion of an integrated circuit block, e.g., microprocessor (MP). The electrical contacts along at least a portion of a boundary of the power gate ring define a substantially non-linear profile configured and arranged to provide an increased contact density relative to a substantially linear profile for a fixed contact spacing over a fixed running boundary length.

Another aspect of the invention features a method of controlling current throughput at a power gate. The method includes providing a power gate having a boundary defined by a series of electrical contacts electrically coupled to corresponding power gate transistors; and arranging in a substantially non-linear pattern a segment of the series of electrical contacts along a running length of the power gate boundary.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
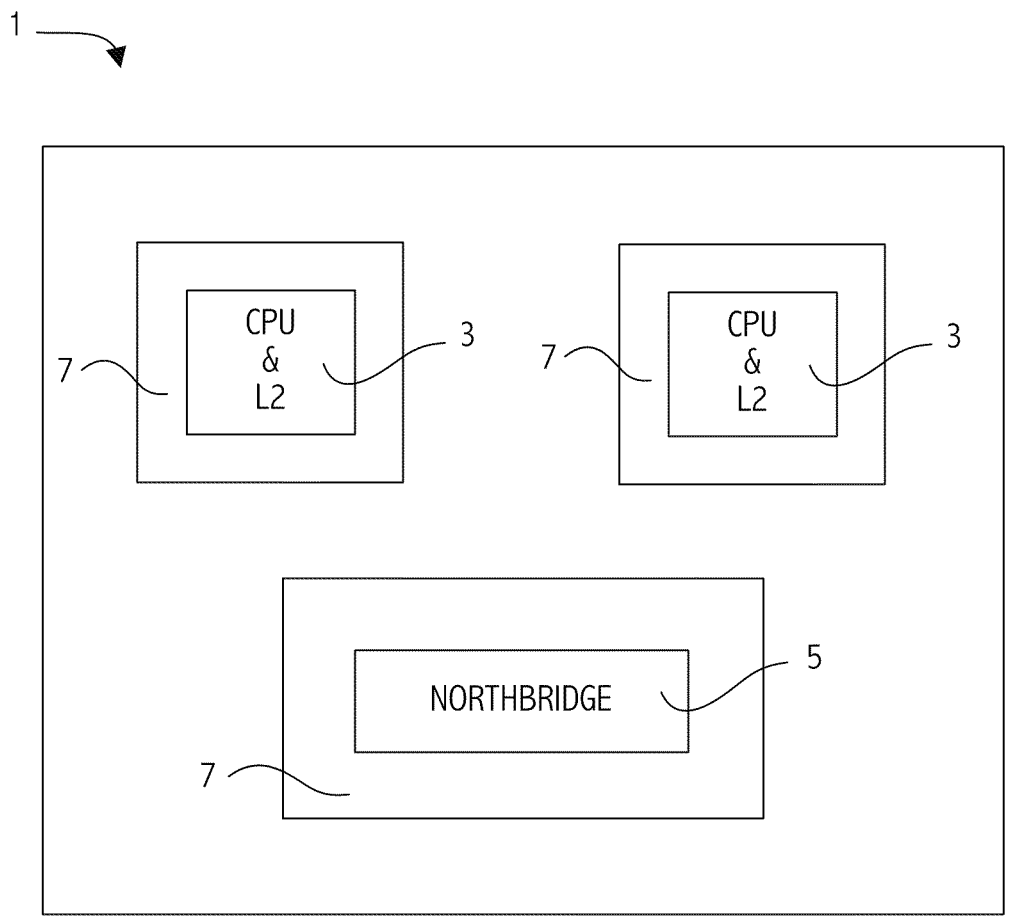
FIG. 1 is a top view of a multi-block ring power gated arrangement.

With reference to FIG. 1, a power gated arrangement 1, includes multiple CPUs 3 and ring power gates 7 associated with each of CPUs 3. A ring power gate 7 may also be used with a northbridge circuit 5. Ring power gates 7 include parallel power gate transistors for directing the VSS or VDD current to CPUs 3 from a power supply. Thus, core-level power gating can be provided by ring power gates 7 surrounding the CPU 3 and L2 cache.

Figure 2:
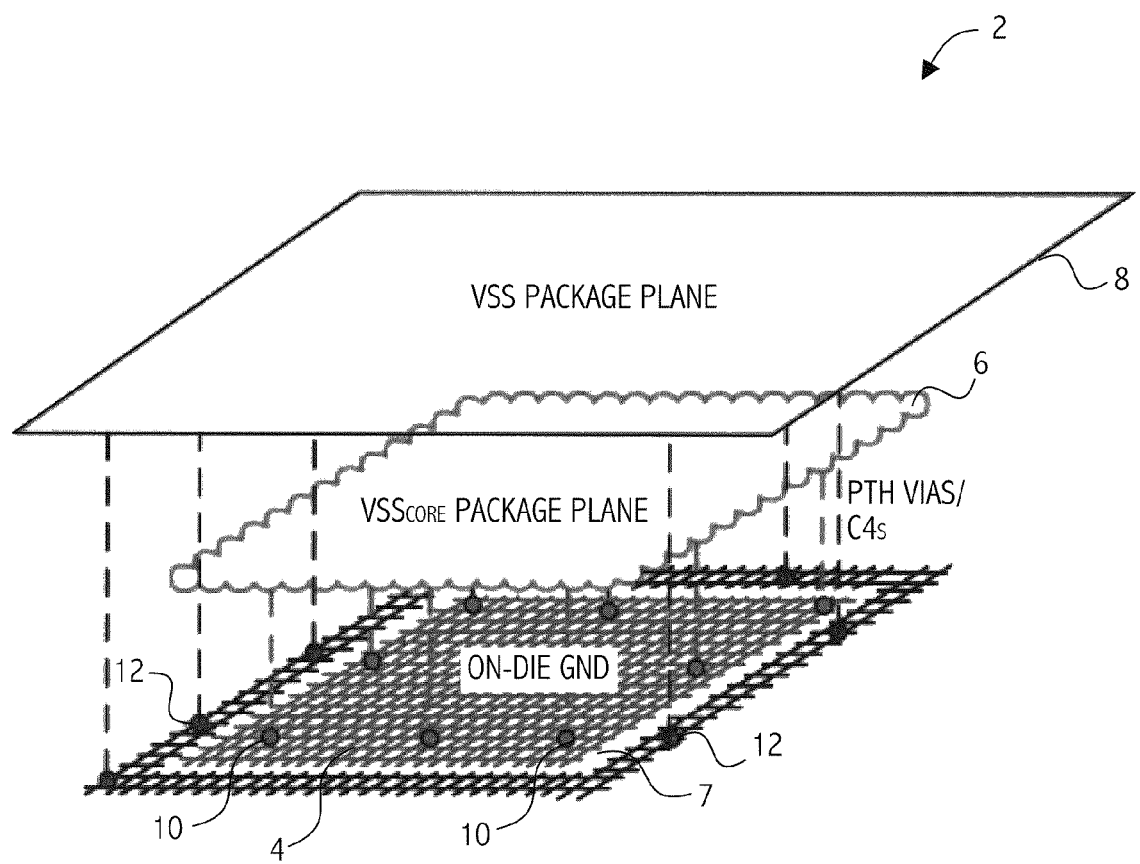
FIG. 2 is an exploded view of a ring power gated arrangement.

With reference to FIG. 2, a ring power gated package 2 includes an on-die grid layer 4 above an integrated circuit die or portion of a die, e.g., CPU. A VSScore package plane or layer 6, and a VSS package plane or layer 8 overlay grid layer 4. The core package layer 6 can be a single block package layer and the VSS package layer 8 can be a multi-block package layer. A first series of electrical contacts 10 on the on-die grid layer 4 contact the VSScore package layer 6. A ring power gate 7 is formed by power gating transistors (illustrated in FIG. 6) provided between a first series of contacts 10 and a second series of electrical contacts 12 to control the current flow between the VSScore package layer 6 and the VSS package layer 8. The dedicated package layer 6 is a package assist feature that provides a low impedance path for current to the power gate ring. The package layer 6 is connected to the core through C4 bumps.

Figure 3:
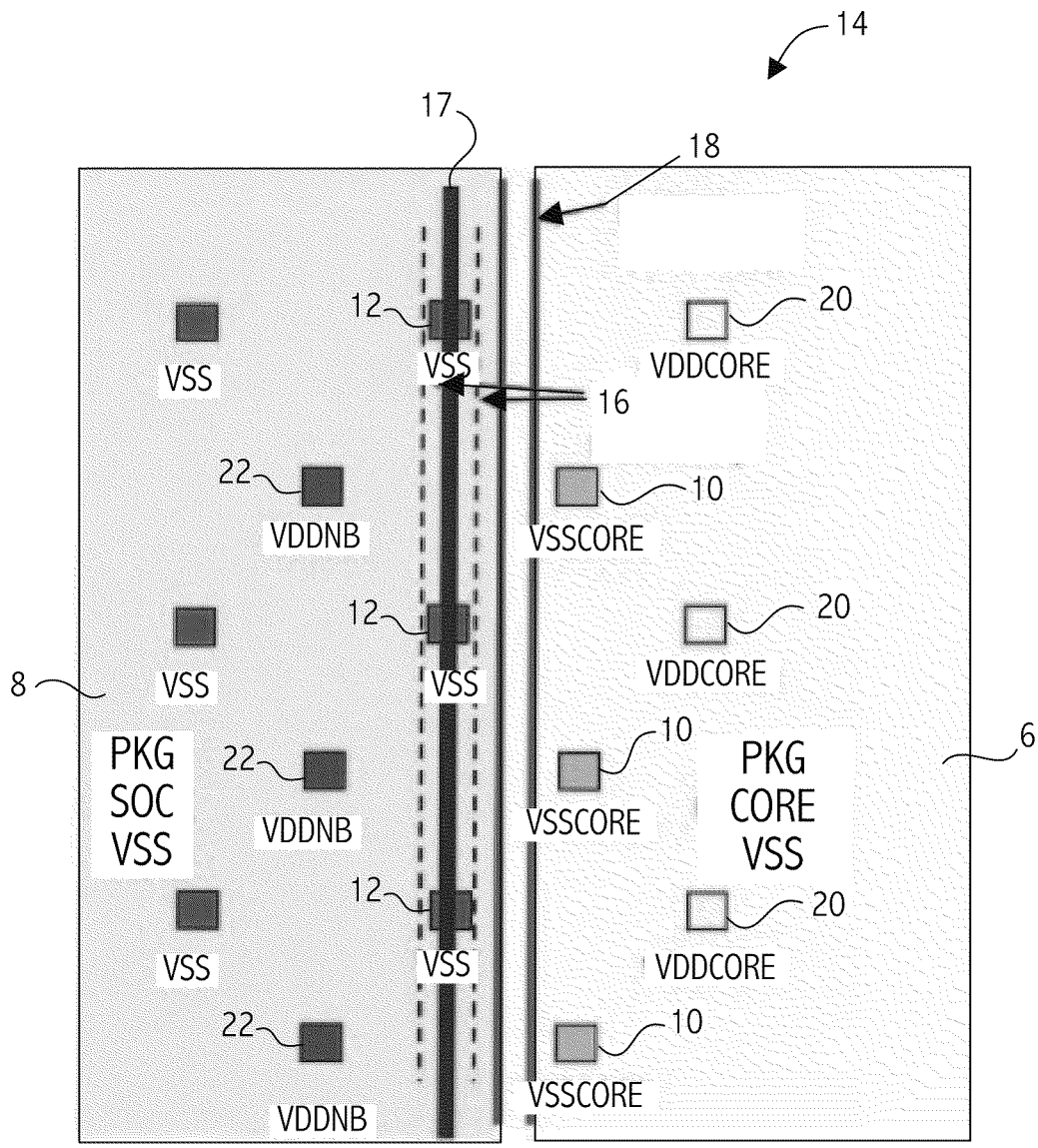
FIG. 3 is a top view of a portion of a linear contact profile along a power gate running boundary length.

With reference to FIG. 3, a portion of a power gated package 14 defines a power gate boundary 16 along the package plane periphery 18. Along the "straight-edge" periphery 18 are substantially linear contact arrangements or "profiles" of the series of contacts 10 and 12. Contact density or contact profiles are sometimes described herein with reference to a fixed linear distance along a power gate boundary or a "running boundary length" 17. The "running boundary length" 17 is a lineal distance reference for determining contact density along the boundary and does not limit the arrangement or placement of the power gate transistors. For example, a non-linear contact profile provides an increased contact density over a fixed running boundary length as compared to a linear contact profile for the same contact spacing. Thus, the running boundary length does not refer to the linearity or non-linearity of the power gate or block perimeter, but rather, to a predetermined linear distance along the power gate boundary. Similarly, power gates may be arranged or associated with an integrated circuit in different ways and placement is not limited to location along a perimeter or periphery of an integrated circuit.

C4 bump contact locations are shown for VSSCORE (VSS gated supply) contacts 10, VDDCORE contacts 20, VSS (ungated supply) contacts 12, and VDDNB contacts 22. In some applications, current flow hot spots can cause the VSSCORE contacts 10 and VSS contacts 12 or bumps along the gate boundary 16 to exceed the C4 limits, e.g., >350 mA per C4.

Figure 4:
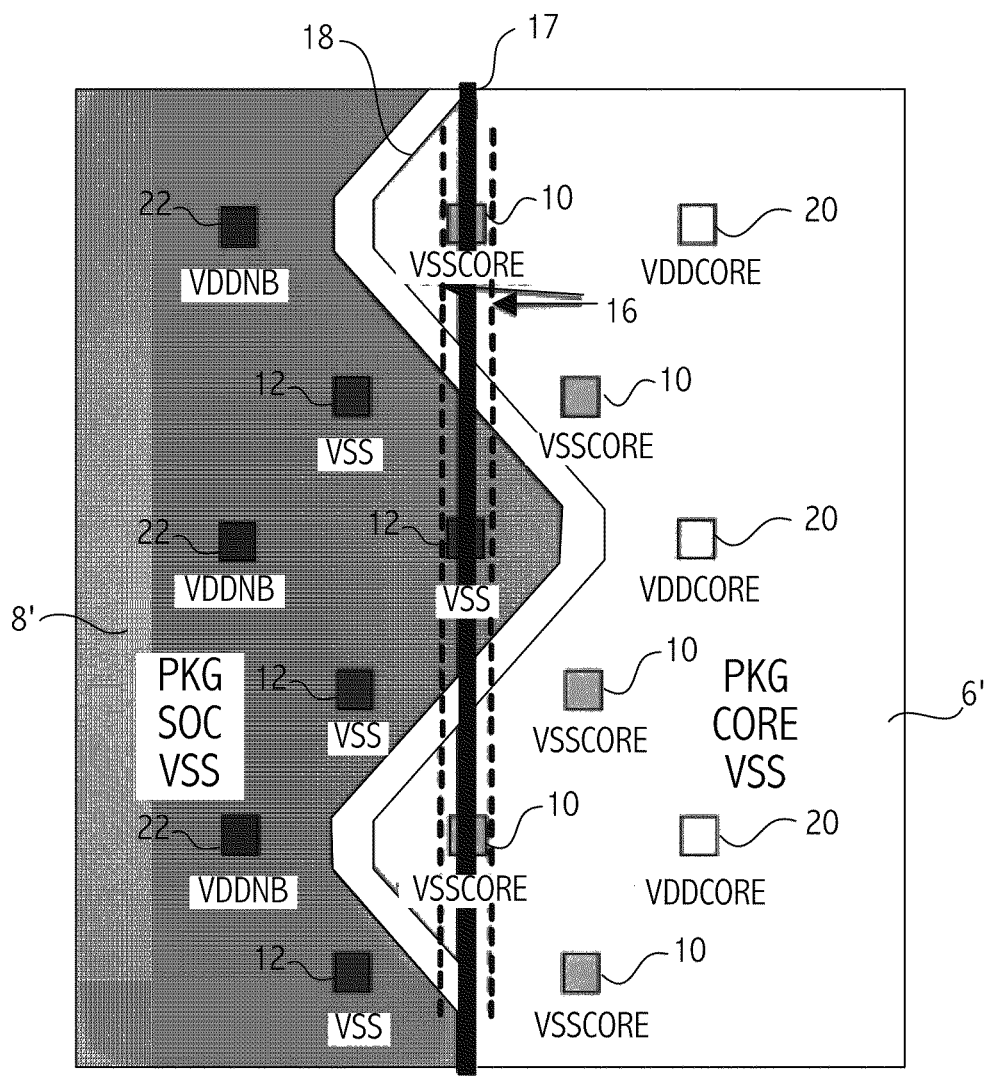
FIG. 4 is a top view of a substantially non-linear contact profile along a power gate running boundary length.

With reference to FIG. 4, improved current throughput and current balancing can be provided by arranging contacts 10 and 12 in a non-linear profile to provide increased contact density along power gate running boundary length 17. A "zigzag" pattern or non-linear profile of VSS/VSSCORE bump contacts 10, 12 line the block periphery 18. In the illustrated implementation, a zigzag profile can provide in some instances 50 percent more C4 VSS/VSSCORE contacts 10, 12 along the periphery of the supply plane (VSSCORE) 6' and the VSS supply plane 8' as compared to the linear profile of FIG. 2 for the same running boundary length 17.

Non-linear contact profiles were experimentally shown to improve current throughput performance relative to linear contact profiles. In particular, use of a non-linear or zigzag power C4 bump configuration was shown to reduce the maximum current in any C4 bump. Similarly, an increase in the number of C4 contacts due to one or more non-linear edges increases current capability and reduces hot spots.

Figure 5:
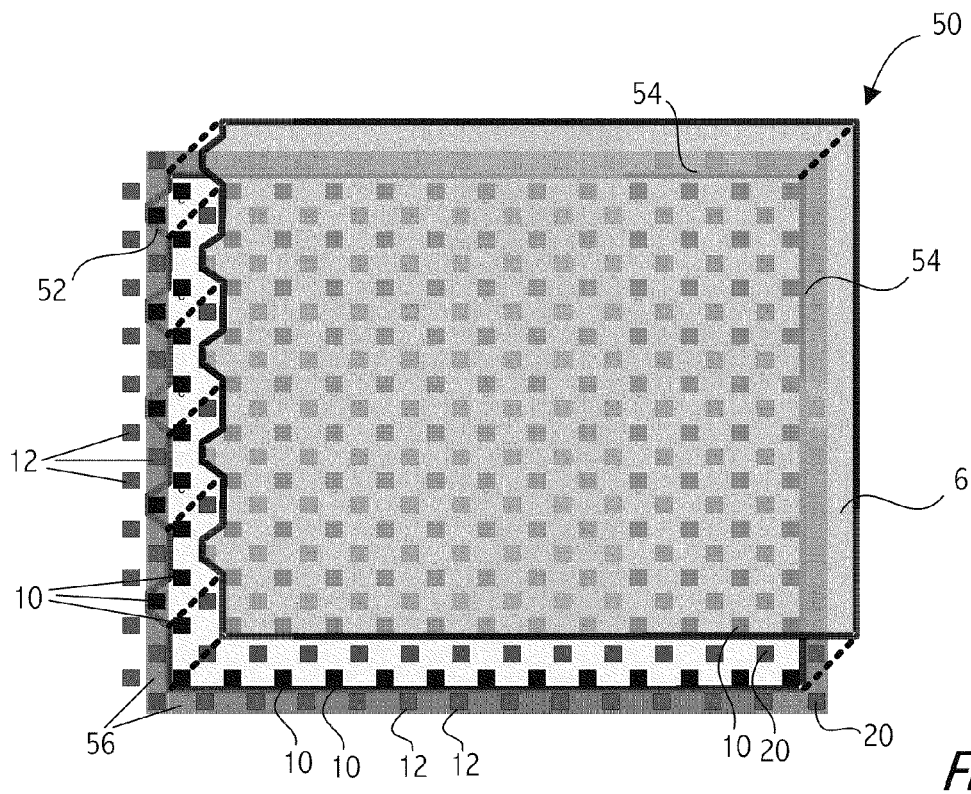
FIG. 5 is a top view of a power gated arrangement including one substantially non-linear contact profile and three substantial linear contact profiles.

With reference to FIG. 5, an integrated circuit block 50 is encompassed by a power gate ring footer 56. A zigzag or non-linear contact profile 52 is provided along the left block edge and linear contact profiles 54 along the three other block edges. The non-linear or zigzag contact pattern 52 on the VSS/VSSCORE boundary on the left side of the core provides additional peripheral contact density so maximum bump currents do not exceed the C4 EM limit at the highest-power operating points. VDDCORE bumps 20 are placed at the corners to minimize current-crowding effects and to provide a low-impedance path to ESD devices within the power gate ring.

SOI processes can be used for gating of VSS with Vt NMOS logic devices without the need for extra processing steps to reduce on-state resistance. In a particular implementation, in addition to two 16×M10 and M11 metal layers, a low-impedance package layer 6 can be provided for use as a virtual-ground layer, eliminating the need for an ultra-thick silicon metallization layer, minimizing the voltage loss across the thick package layer 6.

The impedance paths to VSS and VSSCORE bumps 12, 10 from the footer devices are carefully balanced. In a particular implementation, the power gate ring uses 1.38 m of NMOS width, providing a worst-case effective resistance of about 1.1 mΩ on the ground rail to the center of the core and resulting in <1% frequency loss.

VSScore C4 contacts 10 are provided at fixed intervals around the core periphery. Additionally, contacts 10 may also be provided on an interior portion on the integrated circuit block. The bump/contact density along the non-linear contact profile 52 is about 50 percent greater than contact densities along linear profiles 54, due to the presence of intermediate VSScore bumps 10 in the outcroppings or extensions of profile 52. Similarly, corresponding VSSreal contacts/bumps 12 are provided around the boundaries with a corresponding increased density along the non-linear profile 52.

The increased contact/bump density along non-linear profile 52 can provide increased current throughput and reduced hot spots through improved current balancing across an increased number of contacts. Use of non-linear profiles with increased contact densities provides improved ring style power gating which is particularly advantageous on higher power blocks such as microprocessor cores or graphics cores. For example, such gating may alleviate a current hot spot that previously prevented a core from achieving optimum or maximum clocking frequencies.

Advantageously, shutting down the power of an inactive core in a core level CC6 power mode can provide significant power savings, e.g., up to about 6 A of current per core. Thus, core level power gating can conserve power with multiple cores per chip. Additionally, redirection of power from an inactive core to an active core can provide increased active core speed.

In some implementations, inter-digitated metal fingers may be used to spread the current from the C4 bumps to the regions above the power gate FETs.

Figure 6:
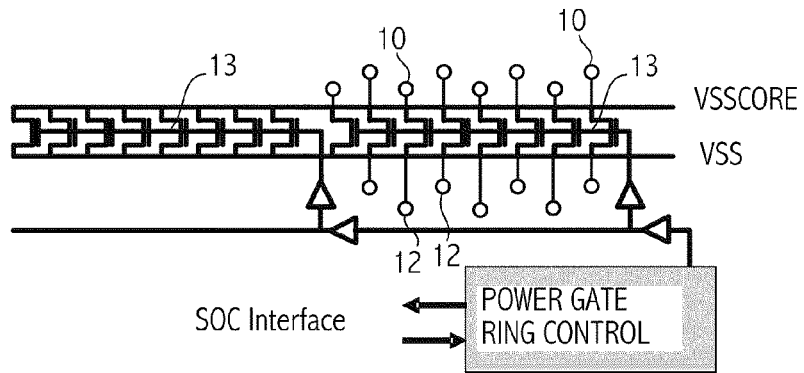
FIG. 6 is a schematic view of a power gate with a non-linear contact profile.

With reference to FIG. 6, footer power gate switches 13 are connected on one side to the VSScore via contacts 10 and on the other side to VSS via contacts 12. Contacts 10 and 12 are arranged in a substantially non-linear profile, providing increased contact density and improved current balancing and/or current throughput.

Figure 7:
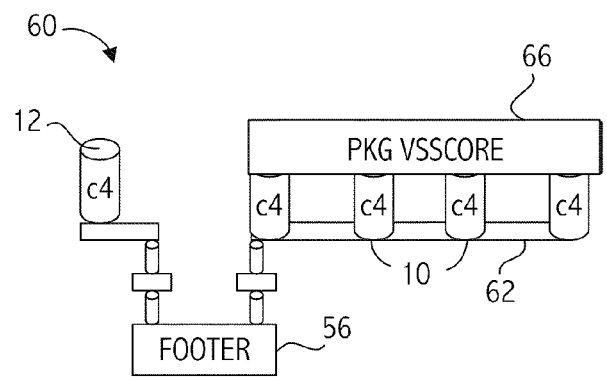
FIG. 7 is a side view of a power gate contact arrangement.

With reference to FIG. 7, a power gate structure 60 includes circuit block 62, and a VSScore package layer 66. C4 bump contacts 10 are electrically coupled to both block 62 and VSScore package layer 66 across the package area and to footer 56 at the package periphery. Footer 56 includes power gate transistors or switches, e.g., NFETs, provided between contacts 10 on block 62 and contacts 12.

Use of non-linear contact profiles along the power gate boundary can be used to maximize the number or density of contacts and via holes and to reduce resistance while providing high density WFET/Area2, e.g., 3.6 um total FET width per footer cell.

Additional non-linear boundary profile design advantages may include reduced complexity of custom circuits using ring power gating and increased socket compatibility by adding core gating functionality while preserving socket pin position and definition.

While circuits and physical structures are generally presumed, it is well recognized that in modern semiconductor design and fabrication, physical structures and circuits may be embodied in computer-readable descriptive form suitable for use in subsequent design, test or fabrication stages. Structures and functionality presented as discrete components in the exemplary configurations may be implemented as a combined structure or component. The invention is contemplated to include circuits, systems of circuits, related methods, and computer-readable medium encodings of such circuits, systems, and methods, all as described herein, and as defined in the appended claims. As used herein, a computer-readable storage medium includes at least one of disk, tape, or other magnetic, optical, semiconductor medium (e.g., flash memory cards, ROM). In some cases, circuitry can be the result of configuring a manufacturing facility (FAB) based on computer readable media instructions (e.g., Verilog, HDL, GDSII data) used to generate masks to create the circuitry.

A number of implementations of the invention have been described. Nevertheless, it will be understood that various modifications may be made without departing from the spirit and scope of the invention. For example, the disclosed gating structures can be used for VDD gating as well as VSS gating, or for placement at other than an integrated circuit periphery. Additionally, any number of non-linear and linear contact profiles may be arranged in various combinations along a power gating boundary. Thus, it will be appreciated that arranging electrical contacts connected via a plurality of power gate transistors in a non-linear profile can provide contact density and performance advantages over a linear profile for a fixed linear distance. Accordingly, other implementations or embodiments are within the scope of the following claims.

What is claimed is:

1. An apparatus comprising:
   a first plurality of electrical contacts associated with a portion of an integrated circuit;
   a second plurality of electrical contacts associated with the portion of the integrated circuit; and
   a plurality of power gate transistors electrically coupled between the first plurality of electrical contacts and the second plurality of electrical contacts, the plurality of power gate transistors to control current flow from the first plurality of electrical contacts to the second plurality of electrical contacts;
   wherein the first plurality of electrical contacts are disposed in a first substantially non-linear profile relative to a first running boundary length adjacent to the first plurality of electrical contacts; and
   wherein the second plurality of electrical contacts are disposed in a second substantially non-linear profile relative to a second running boundary length adjacent to the second plurality of electrical contacts.

2. The apparatus as recited in claim 1, wherein the first substantially non-linear profile provides an increased contact density relative to a substantially linear profile for a fixed contact spacing over the first running boundary length.

3. The apparatus as recited in claim 2, wherein the increased contact density accommodates a higher maximum current capacity over the first running boundary length relative to the substantially linear contact profile over the first running boundary length.

4. The apparatus as recited in claim 1, wherein the apparatus is configured as a ring power gate.

5. The apparatus as recited in claim 1, further comprising an integrated circuit package layer configured to provide a low impedance current path to the power gate transistors.

6. The apparatus as recited in claim 1, further comprising a voltage source package layer electrically coupled to the power gate transistors through the first plurality of contacts.

7. The apparatus as recited in claim 1, wherein a contact density of the non-linear profile is about 50 percent greater than a contact density of a linear profile.

8. The apparatus as recited in claim 1, wherein the first substantially non-linear contact profile is one of a sinusoidal pattern and a zigzag pattern.

9. The apparatus as recited in claim 1, wherein the first and second plurality of electrical contacts are located at a periphery of the integrated circuit.

10. The apparatus as recited in claim 1, further comprising a block package layer electrically coupled to the power gate transistors through at least some of the first plurality of electrical contacts.

11. The apparatus as recited in claim 10, further comprising a multi-block package layer electrically coupled to the power gate transistors.

12. The apparatus as recited in claim 10, wherein the block package layer is configured to provide a low impedance path for current from the block package layer to the power gate transistors.

13. The apparatus as recited in claim 1, further comprising:
   a voltage source package layer electrically coupled to the first plurality of electrical contacts.

14. The apparatus as recited in claim 1 further comprising:
   a first planar layer coupled to the first plurality of contacts; and
   a second planar layer coupled to the second plurality of contacts.

15. The apparatus as recited in claim 14 further comprising:
   a second plurality of power gate transistors;
   a third plurality of contacts arranged linearly and electrically coupling the first planar layer and the second plurality of power gate transistors; and
   a fourth plurality of contacts arranged linearly and electrically coupling the second plurality of power gate transistors and the second planar layer.

16. The apparatus as recited in claim 1 further comprising:
   a first layer coupled to the first plurality of contacts; and
   a second layer coupled to the second plurality of contacts;
   wherein the power gate transistors control current flow from the first layer to the second layer.

17. A computer readable storage medium storing a computer readable representation of an integrated circuit, the integrated circuit including:
   a first series of electrical contacts;
   a second series of electrical contacts; and
   a plurality of power gate transistors electrically coupled between the first series of electrical contacts and the second series of electrical contacts, the plurality of power gate transistors to control current flow from the first plurality of electrical contacts to the second plurality of electrical contacts;
   wherein the first series of electrical contacts are disposed in a substantially non-linear profile relative to a first running boundary length adjacent to the first series of electrical contacts; and
   wherein the second series of electrical contacts are disposed in a substantially non-linear profile relative to a second running boundary length adjacent to the second series of electrical contacts.

18. A method comprising:
   supplying current from a first low impedance planar layer to a plurality of power gate transistors through a first plurality electrical contacts arranged in a zigzag pattern relative to a first running boundary length adjacent to the first plurality of electrical contacts; and supplying the current from the plurality of transistors to a second low impedance planar layer through a second plurality electrical contacts arranged in a zigzag pattern relative to a second running boundary length adjacent to the second plurality of electrical contacts;

wherein the plurality of power gate transistors control flow of the current from the first plurality of electrical contacts to the second plurality of electrical contacts.

\* \* \* \* \*